United States Patent
Liu et al.

(10) Patent No.: US 7,649,408 B2
(45) Date of Patent: Jan. 19, 2010

(54) LOOP FILTERS

(75) Inventors: Zhongding Liu, Taipei County (TW); Jingran Qu, Taipei County (TW)

(73) Assignee: VIA Technologies, Inc., Taipei (TW)

( * ) Notice: Subject to any disclaimer, the term of this patent is extended or adjusted under 35 U.S.C. 154(b) by 43 days.

(21) Appl. No.: 12/102,107

(22) Filed: Apr. 14, 2008

(65) Prior Publication Data

US 2009/0085621 A1 Apr. 2, 2009

(30) Foreign Application Priority Data

Oct. 1, 2007 (TW) .............................. 96136739 A

(51) Int. Cl.
*H03B 1/00* (2006.01)
*H03K 5/00* (2006.01)
(52) U.S. Cl. ................... 327/558; 327/156; 327/552; 331/17; 331/34; 331/36 C
(58) Field of Classification Search ................ 327/147, 327/148, 156, 157, 551–559; 331/16, 17, 331/34, 36 C See application file for complete search history.

(56) References Cited

U.S. PATENT DOCUMENTS 6,861,898 B2 * 3/2005 Hsu et al. ................. 327/552
7,161,417 B2 * 1/2007 Hsu et al. ................. 327/552

* cited by examiner

*Primary Examiner*—Lincoln Donovan
*Assistant Examiner*—Patrick O'Neill
(74) *Attorney, Agent, or Firm*—Thomas, Kayden, Horstemeyer & Risley

(57) ABSTRACT

Loop filters are provided, in which a first resistor comprises a first terminal coupled to a first node, and a second terminal coupled to a second node; a first capacitor is coupled between the second node and a ground voltage, a second resistor comprises a first terminal coupled to the first node and a second terminal coupled to a third node. An operational amplifier comprises a non-inversion input terminal coupled to the second node, an inversion input terminal coupled to the third node, and an output terminal, and a second capacitor is coupled between the output terminal of the operational amplifier and the third node.

16 Claims, 6 Drawing Sheets

LOOP FILTERS

BACKGROUND OF THE INVENTION

1. Field of the Invention

The invention relates to loop filters, and in particular to loop filters with increased capacitance.

2. Description of the Related Art

A clock generator is of great importance in modern synchronous systems, such as computer systems, and communication equipments. Phase lock loops (PLL) are widely used in frequency synthesis, clock correction, clock distribution and phase demodulation.

Generally, typical phase lock loops comprise a phase frequency detector (PFD), a charge pump, a loop filter, a voltage controlled oscillator (VCO) and a divider. The PFD detects the transitional edge of the feedback clock and a reference clock to generate a comparison signal, such that the charge pump is charged or discharged accordingly. The loop filter then generates a control voltage according to the charge/discharge of the charge pump, and the VCO determines the frequency of the clock thereof according to the control voltage. The frequency divider performs frequency division to the clock output from the VCO and outputs the divided clock to the PFD.

The loop filter typically comprises at least one capacitor to filter noise. The greater the equivalent capacitance of the loop filter is, the lesser the bandwidth of the phase lock loop and the greater the phase margin. Meanwhile, the greater the capacitance of the loop filter is, the greater the occupied area of the capacitor.

BRIEF SUMMARY OF THE INVENTION

Embodiments of a loop filter are provided, in which a first resistor comprises a first terminal coupled to a first node, and a second terminal coupled to a second node, a first capacitor is coupled between the second node and a ground voltage, and a second resistor comprises a first terminal coupled to the first node and a second terminal coupled to a third node. An operational amplifier comprises a non-inversion input terminal coupled to the second node, an inversion input terminal coupled to the third node, and an output terminal, and a second capacitor is coupled between the output terminal of the operational amplifier and the third node.

The invention provides an embodiment of phase locked loop, in which a phase frequency detector compares a transitional edge of a feedback clock with that of a reference clock to generate a comparison signal. A loop filter comprises a first resistor comprising a first terminal coupled to a first node and a second terminal coupled to a second node, a first capacitor coupled between the second node and a ground voltage, a second resistor comprising a first terminal coupled to the first node and a second terminal coupled to a third node, an operational amplifier comprising a non-inversion input terminal coupled to the second node, an inversion input terminal coupled to the third node, and an output terminal, and a second capacitor coupled between the output terminal of the operational amplifier and the third node. A charge pump is coupled to the first node, to charge or discharge the loop filter according to the comparison signal, thereby generating a control voltage at the first node. A voltage controlled oscillator outputs a corresponding clock according to the control voltage, and a frequency divider performs frequency-dividing to the corresponding clock to output the feedback clock to the phase frequency detector.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
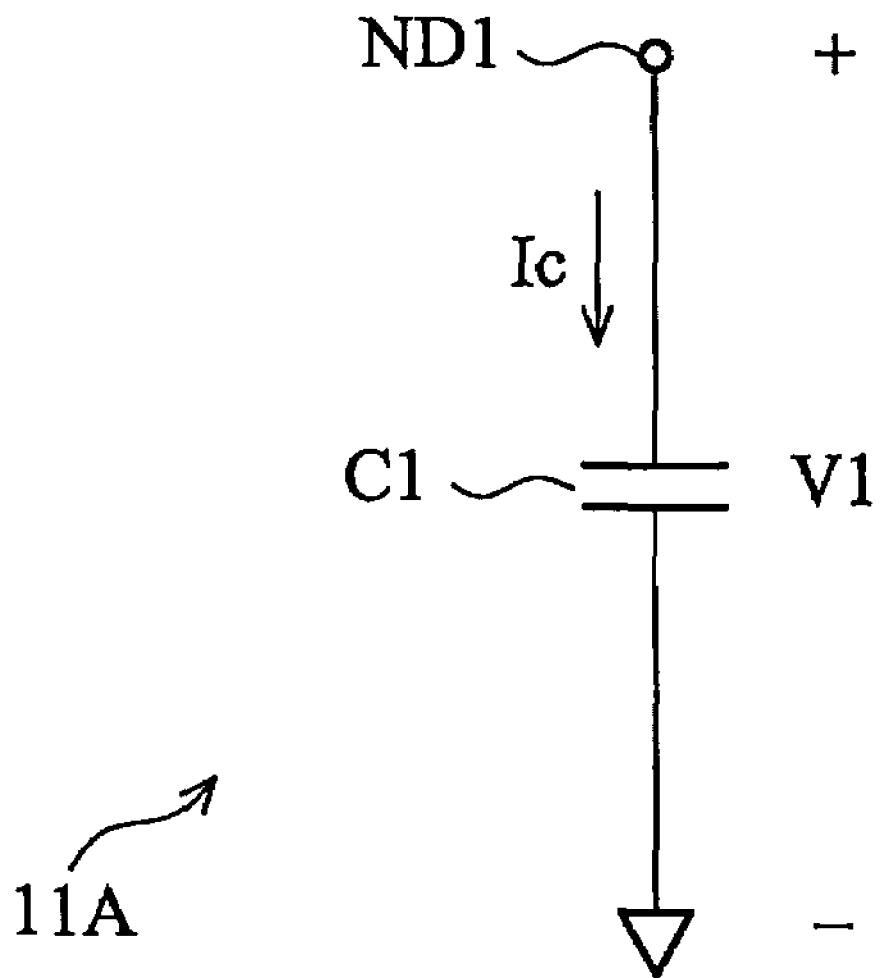
FIG. 1 shows an embodiment of a loop filter according to the invention.

FIG. 1 shows an embodiment of a loop filter according to the invention. As shown, the loop filter 11A comprises a capacitor C1 with a first terminal coupled to a node ND1 and a second terminal coupled to a ground terminal. For example, the node ND1 is an output terminal of a charge pump in a phase lock loop, but is not limited thereto.

Assuming that the voltage across the capacitor C1 is V1, then the current Ic through the capacitor C1 can be represented as:

$$Ic = C1 \times \frac{dV1}{dt} \qquad (1)$$

Namely, the current Ic and the capacitor C1 would have a positive proportional relationship when $$\frac{dV1}{dt}$$

is fixed, i.e. voltage V1 is fixed.

Figure 2A:
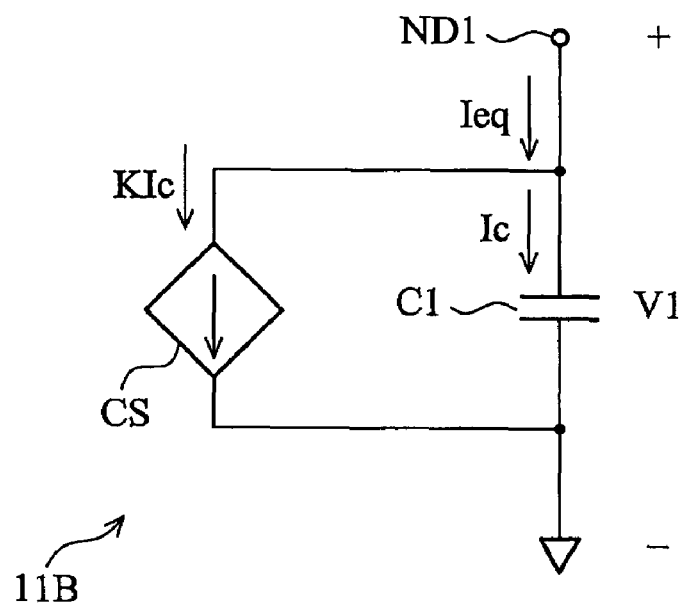
FIG. 2A shows another embodiment of a loop filter according to the invention.
Figure 2B:
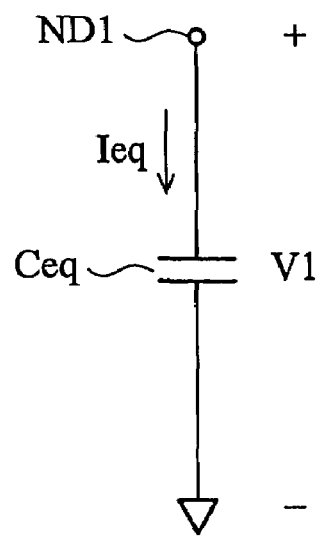
FIG. 2B shows an equivalent circuit of the loop filter as shown in FIG. 2A.

FIG. 2A shows another embodiment of a loop filter, and FIG. 2B shows an equivalent circuit of the loop filter shown in FIG. 2A. As shown in FIG. 2A, the loop filter 11B is similar to that shown in FIG. 1, with a difference in that a current source CS is added to couple between the node ND1 and the ground voltage, and the current source CS is coupled to the capacitor C1 in parallel to provide a current which is K times the current Ic. Namely, the current Ieq is equal to (1+K) Ic, i.e., Ieq=Ic+KIc=(1+K)Ic.

Because the voltage across the capacitor C1 is V1 in both loop filters 11A and 11B and the current Ieq is (1+K) Ic, the formula (1) can be rewritten as:

$$Ieq = (1+K) \times C1 \times \frac{dV1}{dt} = Ceq \times \frac{dV1}{dt} \qquad (2)$$

Wherein Ceq represents the equivalent capacitor of the loop filter 11B as shown in FIG. 2B, i.e., the capacitor C1 and the current source CS. Because $$\frac{dV1}{dt}$$

is equal to that in FIG. 1 and the current Ieq is (1+K) Ic, the equivalent capacitor Ceq in the loop filter 11B can be (1+K) C1, i.e., Ceq=(1+K)×C1. Namely, the loop filter 11B increases the current Ieq from the node to the ground terminal to be (1+K) Ic by fixing the voltage across the capacitor C1, such that the equivalent capacitor Ceq of the loop filter 11B can be increased to be (1+K) C1.

Thus, compared to the conventional method for increasing equivalent capacitance by a conventional capacitor, the invention can increase the equivalent capacitance without greatly increasing occupied area.

Figure 3A:
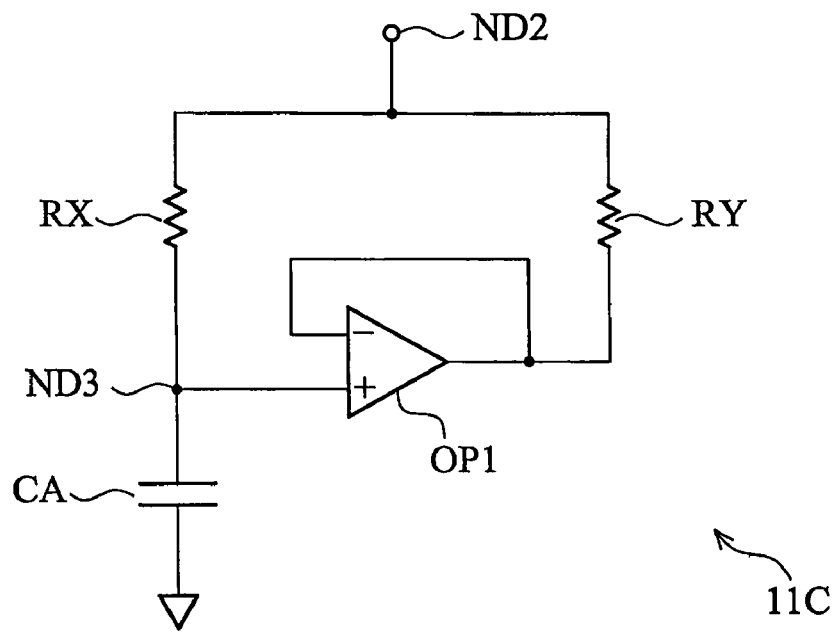
FIG. 3A shows another embodiment of a loop filter according to the invention.

FIG. 3A shows another embodiment of a loop filter. As shown, the loop filter 11C comprises resistors RX and RY, a capacitor CA and an operational amplifier OP1. The operational amplifier OP1 is connected to be a source follower and coupled between the node ND3 and the resistor RY. For example, the operational amplifier OP1 comprises a non-inversion input terminal coupled to the ND3, an output terminal coupled to the resistor RY, and an inversion input terminal coupled to an output terminal thereof and the resistor RX. The resistor RX has two terminals coupled to the nodes ND2 and ND3 respectively, and the capacitor C1 is coupled between the node ND3 and the ground terminal. The resistor RY comprises a first terminal coupled to the node ND2 and a second terminal coupled to the output terminal and the inversion terminal of the operational amplifier OP1.

Because the inversion input terminal and the non-inversion input terminal of the operational amplifier OP1 are virtual shorted, the resistors RX and the RY can be regarded as two paralleled-connected resistors. Thus, the equivalent resistance RZ of the resistors RX and RY would be lower than that of the resistor RX or RY, and the current through the capacitor CA would be increased.

Figure 3B:
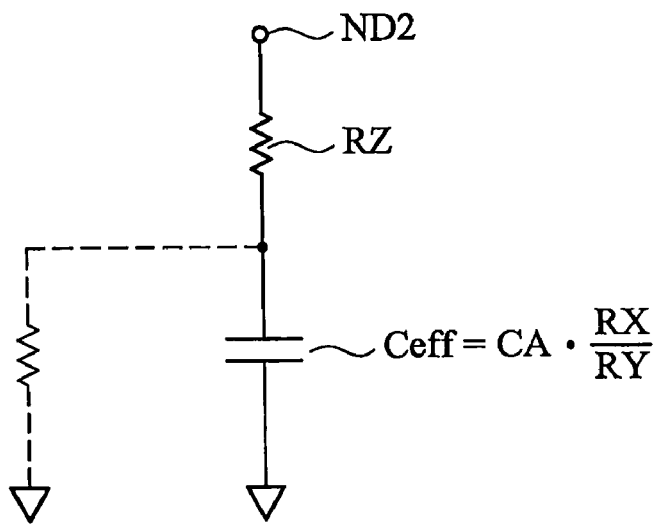
FIG. 3B shows an equivalent circuit of the loop filter as shown in FIG. 3A.

FIG. 3B shows an equivalent diagram of the loop filter shown in FIG. 3A. As shown, the equivalent capacitance of the equivalent capacitance Ceff in the loop filter 11C can be represented as $$Ceff = CA \frac{RX}{RY}.$$

Namely, the equivalent capacitance of the equivalent capacitor Ceff of the loop filter 11C can be increased by adjusting the proportion of the resistors RX and RY. Thus, the loop filter 11C can avoid increasing occupied area when increasing capacitance. Alternatively, compared to conventional capacitors, the loop filter 11C can provide the same capacitance with smaller occupied area.

However, in a DC state, there is a leakage path between the node ND3 and the ground terminal, and a pole near the origin is generated under frequency analysis, and thus, a phase lock loop using the loop filter cannot accurately lock phase and frequency.

Figure 4:
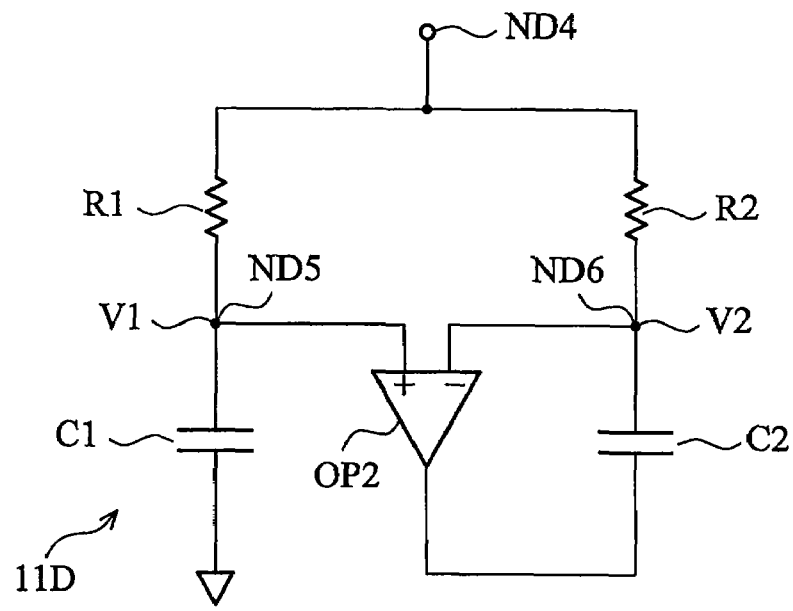
FIG. 4 shows another embodiment of a loop filter according to the invention.

FIG. 4 shows another embodiment of a loop filter. As shown, the loop filter 11D is coupled between the node ND4 and the ground voltage, and comprises resistors R1 and R2, capacitors C1 and C2 and an operational OP2. The operational amplifier OP2 is connected as a source follower and is coupled between the node ND5 and the resistor R2. For example, the operational amplifier OP2 comprises a non-inversion input terminal coupled to the ND5, an output terminal coupled to the node ND6 through the capacitor C2, and an inversion input terminal coupled to the node ND6. The resistor R1 has two terminals coupled to the node ND4 and ND5 respectively, the capacitor is coupled between the node ND5 and the ground terminal, and the resistor R2 comprises a first terminal coupled to the node ND4 and a second terminal coupled to the capacitor C2 and the inversion input terminal of the operational amplifier OP1.

Similarly, the capacitance of the equivalent capacitor of the loop filter 11D can be increased by adjusting the proportion of the resistors R1 and R2. Because of the capacitor C2 between the node ND2 and the operational amplifier OP2, the leakage path in the loop filter 11C can be cut off and the pole caused by the leakage path can be accordingly eliminated.

Figure 5:
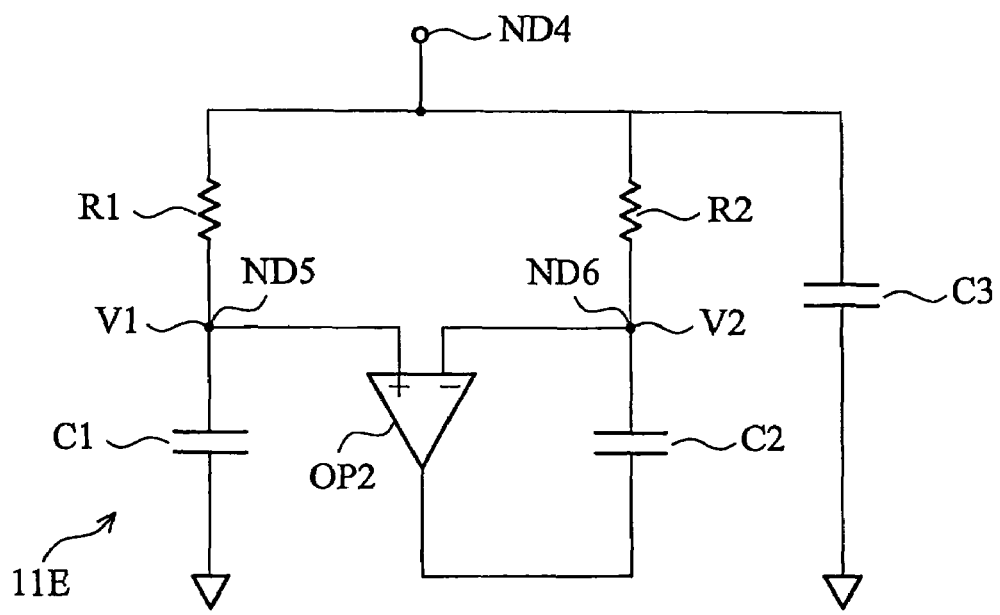
FIG. 5 shows another embodiment of a loop filter according to the invention.

FIG. 5 shows another embodiment of a loop filter. As shown, the loop filter 11E is similar to the loop filter 11D shown in FIG. 4, with a difference in that a capacitor C3 is coupled between the node ND4 and the ground terminal. Similarly, the capacitance of the equivalent capacitor of the loop filter 11D can be increased by adjusting the proportion of the resistors R1 and R2.

Figure 6:
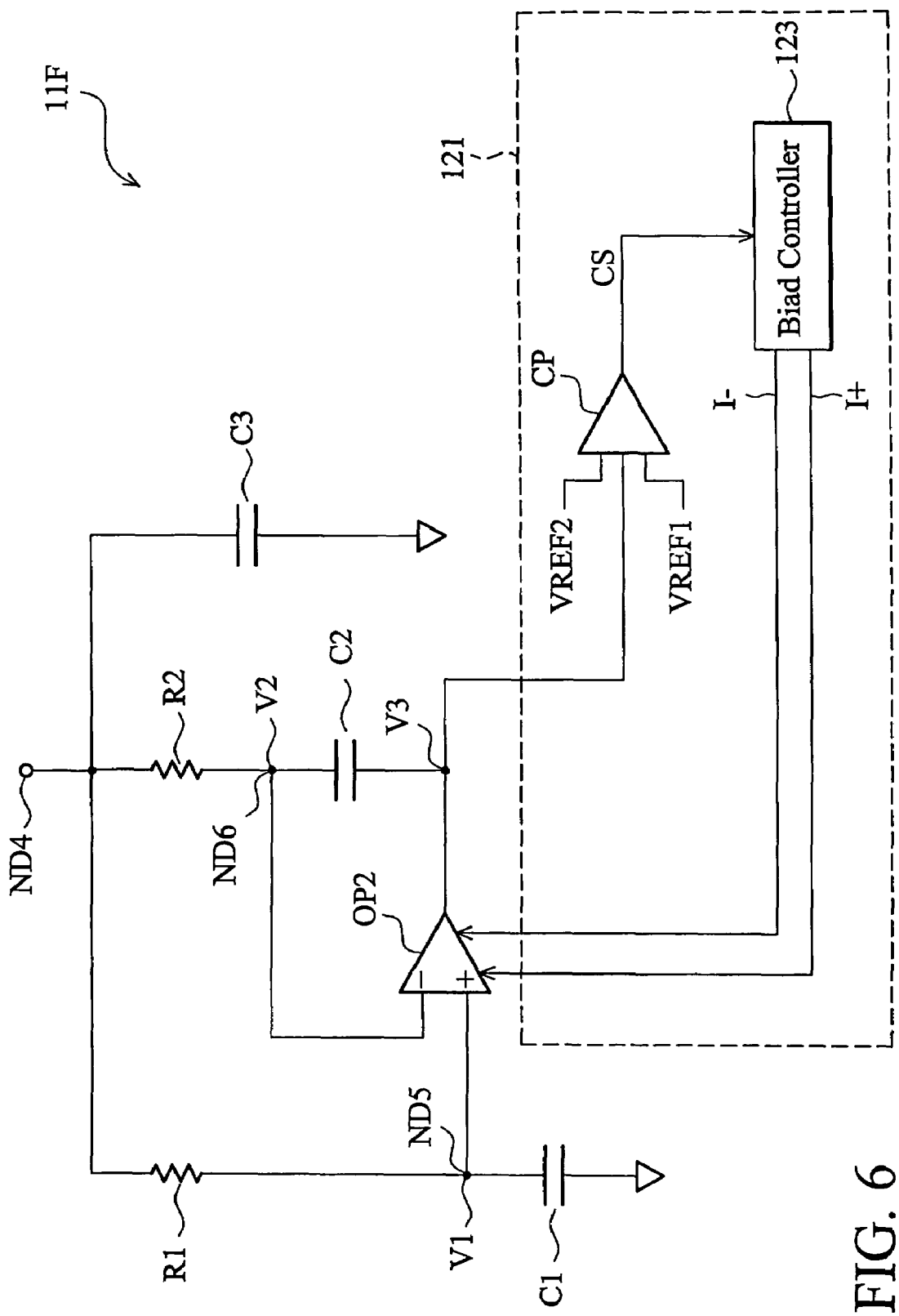
FIG. 6 shows another embodiment of a loop filter according to the invention.

FIG. 6 shows another embodiment of a loop filter. As shown, the loop filter 11F is similar to the loop filter 11E shown in FIG. 5, with a difference in that an offset elimination circuit 121 detects an output voltage V3 at the output terminal of the operational amplifier OP2 to generate a control signal CS for controlling the bias currents I+ and I−, such that the output voltage of the operational amplifier OP2 can be substantially equal to the input voltage V1 thereof. The offset elimination circuit 121 comprises a comparator CP and a bias controller 123. The comparator CP comprises a first input terminal coupled to a first reference voltage VERF1, such as 1.0V, a second input terminal coupled to the output terminal of the operational amplifier OP2, and a third input coupled to a second reference voltage VREF2, such as 1.5V. Generally, the output voltage V1 of the operational amplifier OP2 would fall between the reference voltages V1 and V2.

For example, when the output voltage V3 of the operational amplifier OP2 is lower than the reference voltage VREF1, the comparator CP would control the bias controller 12 using the control signal CS, thereby adjusting the bias currents I+ and I− of the operational amplifier OP2, such that the output voltage V3 of the operational amplifier OP2 increases. On the contrary, when the output voltage V3 of the operational amplifier OP2 exceeds the reference voltage VREF2, the comparator CP would control the bias controller 12 using the control signal CS, thereby adjusting the bias currents I+ and I− of the operational amplifier OP2, such that the output voltage V3 of the operational amplifier OP2 decreases. Thus, the output voltage V3 of the operational amplifier OP2 would follow the input voltage V1, i.e., DC offsets in the input voltage V1 and the output voltage V3 can be eliminated. Further, when the output voltage V3 of the operational amplifier OP2 falls between the reference voltages VREF1 and VREF2, the offset elimination circuit 121 does not adjust the bias current I+ and I− of the operational amplifier OP2.

Figure 7:
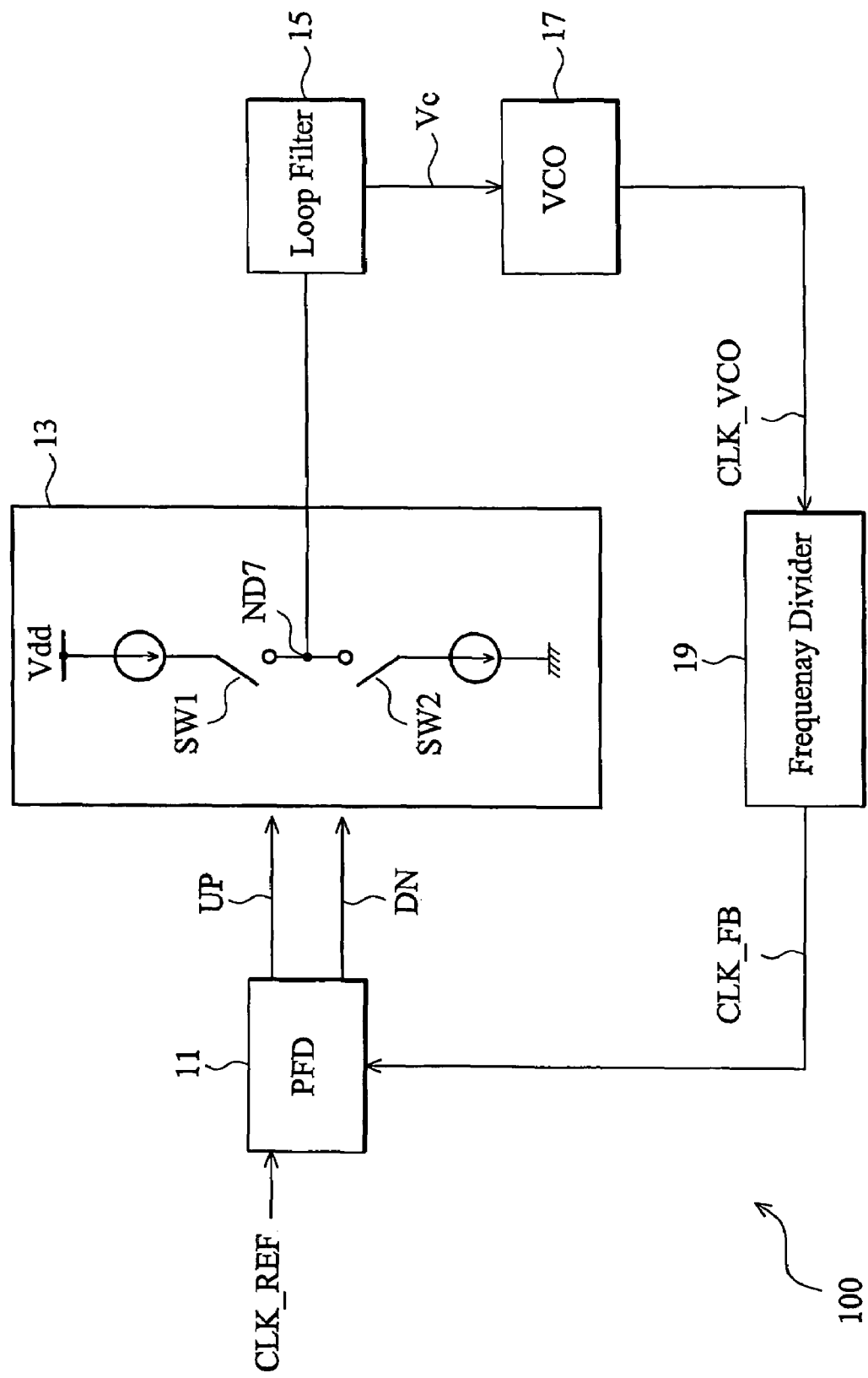
FIG. 7 shows an embodiment of a phase lock loop according to the invention.

FIG. 7 shows an embodiment of a phase lock loop. As shown, the phase lock loop 100 comprises a phase frequency detector (PFD) 11, a charge pump 13, a loop filter 15, a voltage controlled oscillator (VCO) 17 and a frequency divider 19. The phase lock detector 11 compares a transitional edge of a feedback clock CLK_FB with that of a reference clock CLK_REF to generate comparison signals UP and DN, such that the current pump 13 is charged or discharged.

For example, when the transitional edge of the feedback clock CLK_FB leads that of the reference clock CLK_REF, the phase frequency detector 11 turns off the switching element SW1 and turns on the switching element SW2 by the comparison signals UP and DN, thereby discharging the loop filter 15. On the contrary, when the transitional edge of the feedback clock CLK_FB lags that of the reference clock CLK_REF, the phase frequency detector 11 turns on the switching element SW1 and turns off the switching element SW2 by the comparison signals UP and DN, thereby charging the loop filter 15.

The loop filter 15 is coupled to the node ND7 of the charge pump 13 to generate a control voltage VC according to charge or discharge by the charge pump 13. For example, when the loop filter 15 is implemented by the loop filters 11D~11F as shown in FIGS. 4~6, the node ND4 in the loop filters 11D~11F is coupled to the node ND7 in the charge pump 13, and the voltage across the node ND4 and the ground terminal serves as the control voltage VC and output to the VCO 17.

The VCO 17 determines the frequency of the output clock CLK_VCO thereof according to the control voltage VC. For example, when the control voltage VC (i.e., the voltage at the node ND4) is increased, the output clock CLK_VCO of the VCO 17 is accordingly increased. On the contrary, when the control voltage VC (i.e., the voltage at the node ND4) is decreased, the output clock CLK_VCO of the VCO 17 is accordingly decreased. The frequency divider 19 performs frequency division to the output clock CLK_VCO to output the feedback clock CLK_FB to the PFD 11.

In the above embodiments, compared to conventional capacitors, the loop filters 11D~11F can provide the same equivalent capacitance with small occupied area or provide a large equivalent capacitance with the same occupied area. Thus, the phase lock loop using the loop filters 11D~11F can provide a small bandwidth and a larger phase margin under the same occupied area or a smaller occupied area.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A loop filter, comprising:
   a first resistor comprising a first terminal coupled to a first node, and a second terminal coupled to a second node;
   a first capacitor coupled between the second node and a ground voltage;
   a second resistor comprising a first terminal coupled to the first node and a second terminal coupled to a third node;
   an operational amplifier comprising a non-inversion input terminal coupled to the second node, an inversion input terminal coupled to the third node, and an output terminal; and
   a second capacitor coupled between the output terminal of the operational amplifier and the third node.

2. The loop filter as claimed in claim 1, further comprising a third capacitor coupled between the first node and the ground voltage.

3. The loop filter as claimed in claim 1, further comprising an offset elimination circuit to make an output voltage at the output terminal of the operational amplifier to equal to an input voltage at the non-inversion input terminal.

4. The loop filter as claimed in claim 3, wherein the offset elimination circuit detects the output voltage at the output terminal of the operational amplifier to control at least one bias current of the operational amplifier accordingly, such that the output voltage at the output terminal of the operational amplifier equals to the input voltage at the non-inversion input terminal.

5. The loop filter as claimed in claim 4, wherein the offset elimination circuit comprises:
   a comparator detecting the output voltage at the output terminal of the operational amplifier and generating a corresponding control signal accordingly; and
   an offset control circuit controlling the bias current according to the corresponding control signal.

6. The loop filter as claimed in claim 5, wherein, when the output voltage at the output terminal of the operational amplifier is lower than a first voltage, the comparator generates the corresponding control signal, such that the bias controller adjusts the bias current to increase the output voltage of the operational amplifier.

7. The loop filter as claimed in claim 6, where, when the output voltage at the output terminal of the operational amplifier exceeds a second voltage, the comparator generates the corresponding control signal such that the bias controller adjusts the bias current to decrease the output voltage of the operational amplifier.

8. The loop filter as claimed in claim 7, wherein when the output voltage is between the first and second voltages, the offset elimination circuit does not adjust the bias current of the operational amplifier.

9. A phase locked loop, comprising:
   a phase frequency detector comparing a transitional edge of a feedback clock with that of a reference clock to generate a comparison signal;
   a loop filter, comprising:
      a first resistor comprising a first terminal coupled to a first node, and a second terminal coupled to a second node;
      a first capacitor coupled between the second node and a ground voltage;
      a second resistor comprising a first terminal coupled to the first node and a second terminal coupled to a third node;
      an operational amplifier comprising a non-inversion input terminal coupled to the second node, an inversion input terminal coupled to the third node, and an output terminal; and
      a second capacitor coupled between the output terminal of the operational amplifier and the third node;
   a charge pump coupled to the first node, to charge or discharge the loop filter according to the comparison signal, thereby generating a control voltage at the first node;
   a voltage controlled oscillator outputting a corresponding clock according to the control voltage; and
   a frequency divider performing frequency-dividing to the corresponding clock to output the feedback clock to the phase frequency detector.

10. The phase locked loop as claimed in claim 9, further comprising a third capacitor coupled between the first node and the ground voltage.

11. The phase locked loop as claimed in claim 9, further comprising an offset elimination circuit to make an output voltage at the output terminal of the operational amplifier to equal to an input voltage at the non-inversion input terminal.

12. The phase locked loop as claimed in claim 11, wherein the offset elimination circuit detects the output voltage at the output terminal of the operational amplifier to control at least one bias current of the operational amplifier accordingly, such that the output voltage at the output terminal of the operational amplifier equals to the input voltage at the non-inversion input terminal.

13. The phase locked loop as claimed in claim 12, wherein the offset elimination circuit comprises:

a comparator detecting the output voltage at the output terminal of the operational amplifier and generating a corresponding control signal accordingly; and an offset control circuit controlling the bias current according to the corresponding control signal.

14. The phase locked loop as claimed in claim 13, wherein, when the output voltage at the output terminal of the operational amplifier is lower than a first voltage, the comparator generates the corresponding control signal, such that the bias controller adjusts the bias current to increase the output voltage of the operational amplifier.

15. The phase locked loop as claimed in claim 14, where, when the output voltage at the output terminal of the operational amplifier exceeds a second voltage, the comparator generates the corresponding control signal such that the bias controller adjusts the bias current to decrease the output voltage of the operational amplifier.

16. The phase locked loop as claimed in claim 15, wherein when the output voltage is between the first and second voltages, the offset elimination circuit does not adjust the bias current of the operational amplifier.

* * * * *